United States Patent [19]

Kuster et al.

[11] Patent Number: 5,172,394
[45] Date of Patent: Dec. 15, 1992

[54] METHOD FOR REDUCING THE CONTENT OF SPURIOUS SIGNALS IN THE OUTPUT SIGNALS OF A MIXER, AND MIXER FOR CARRYING OUT THE METHOD

[75] Inventors: Anton Kuster, Greifensee; Roland Käppeli, Oberhittnau, both of Switzerland

[73] Assignee: Spectrospin AG, Zurich, Switzerland

[21] Appl. No.: 234,449

[22] Filed: Aug. 19, 1988

[30] Foreign Application Priority Data

Aug. 22, 1987 [DE] Fed. Rep. of Germany ....... 3728020

[51] Int. Cl.[5] .......................................... H04L 27/20
[52] U.S. Cl. ..................................... 375/67; 332/103; 375/60
[58] Field of Search .................. 375/60, 61, 53, 67, 375/46, 39, 41–42; 332/23 A, 37 R, 41, 42, 43, 48, 103, 156, 159–162; 455/109

[56] References Cited

U.S. PATENT DOCUMENTS

| | | | |
|---|---|---|---|
| 3,229,231 | 1/1966 | Saraga | 332/45 |
| 4,090,145 | 5/1978 | Webb | 329/1 |
| 4,404,532 | 9/1983 | Welti | 332/17 |
| 4,462,001 | 7/1984 | Girard | 330/149 |
| 4,593,411 | 6/1986 | Schiller | 455/109 |
| 4,613,976 | 9/1986 | Sewerinson | 375/52 |
| 4,680,775 | 7/1987 | Exarque et al. | 375/39 |
| 4,726,039 | 2/1988 | Piesinger | 375/67 |
| 4,736,170 | 4/1988 | Wu et al. | 375/67 X |

FOREIGN PATENT DOCUMENTS

3007907A1 3/1980 Fed. Rep. of Germany .
3516492A1 5/1985 Fed. Rep. of Germany .

Primary Examiner—Curtis Kuntz
Assistant Examiner—Tesfaldet Bocure
Attorney, Agent, or Firm—Cohn, Powell & Hind

[57] ABSTRACT

Method for reducing the content of spurious signals in the output signal of a mixer and mixer designed for carrying out the method according to the invention. When using quadrature mixtures as generators for tunable rf signals it has been found to be a disadvantage that differences in the two channels of the quadrature mixers lead to a high content of undesirable mixture signals. The content of disturbing mixture signals in the output signals of such mixers is reduced according to the invention by feeding the ring modulators of the quadrature mixer with signals differing from pure sine oscillations, which are phase-shifted relative to each other by 90° and which have been determined in such a manner that all pairs of d.c. signals supplied to the two ring modulators result in output signals which have all the same amplitude and each of which has a phase position conforming exactly to the phase position to which the respective pair of d.c. signals is assigned. By supplying these signals in a cyclical sequence one obtains a modulation signal of predetermined frequency supplying an output signal which is substantially free from undesirable mixture signals and whose frequency is displaced relative to the frequency of the supplied carrier signals by the frequency of the modulation signal.

7 Claims, 6 Drawing Sheets $f_o$ $f_o+100\text{KHz}$ $f_o-100\text{KHz}$ $f_o+200\text{kHz}$ $f_o-200\text{KHz}$ $f_o+300\text{KHz}$ $f_o-300\text{KHz}$ $f_o+400\text{KHz}$ $f_o-400\text{KHz}$

METHOD FOR REDUCING THE CONTENT OF SPURIOUS SIGNALS IN THE OUTPUT SIGNALS OF A MIXER, AND MIXER FOR CARRYING OUT THE METHOD

BACKGROUND OF THE INVENTION

The present invention relates to a method for reducing the content of spurious signals, including the image frequency, in the output signal of a mixer comprising at least two modulators the first inputs which are supplied with a carrier signal of the frequency $f_o$ while their second inputs are supplied with a modulation signal of the frequency $f_m$ in such a manner that the carrier and modulation signals supplied to the one of the at least two modulators are phase-shifted in a predetermined manner relative to the carrier or modulation signal supplied to the at least one other modulator and whose output signals are combined to the output signal of the mixer which has a frequency equal to the sum of the frequencies of the carrier signal and the modulation signal. Mixers of this type have been generally known in the form of quadrature mixtures containing two modulators to which the modulation signal is supplied, phase-shifted by 90°. These quadrature mixers are in extensive use because, theoretically, all other mixture products, including the image frequency, are suppressed, except for the desired output signal having the sum frequency $f_o+f_m$ or $f_o-f_m$. In reality, however, no pure output signal of the frequency $f_o+f_m$ or $f_o-f_m$ can be achieved, not even when the ring modulators are tuned very carefully; instead, there also appear output signals having the frequencies of the other mixture products. The reasons for this are substantially seen in the fact that the characteristic curves of the modulators are not purely quadratic, that no complete symmetry of the modulators can be achieved, that the 90° phase shifters used in the modulator are responsive to frequency and load, that cross-talking occurs in the circuitry, and that finally the modulators do not have constant input and output impedances. Consequently, it has been possible with the aid of such quadrature mixers only to suppress the undesirable mixture products up to approx. 30 db relative to the output signal having the sum frequency. In addition, complex compensation circuits are used for suppressing any spurious signals, such as the compensation circuits known from DE 35 16 492 A1 which use four modulators.

On the other hand, quadrature mixers have quite considerable importance, and this not only as modulators or demodulators, but alos as rf generators of high stability. For generating the rf carrier signal, an oscillator of high stability may be used, while for generating the mixed signal a generator will do whose stability is lower than the stability of the oscillator generating the carrier signal, by the same factor by which the frequency of the modulation signal is lower than the frequency of the carrier signal. It is, however, important, especially in those applications for which such highly stable generators are required, to obtain also a highly pure output signal so that it would be desirable to improve the purity of the output signal of such a quadrature mixer without increasing the circuitry input by the use of additional components, such as modulators and adder or subtractor stages, and this the more as it is a fact that every component contributes itself, to a certain degree, towards distorting the signal and is accordingly detrimental to the generation of an output signal of very high purity.

SUMMARY OF THE INVENTION

It is the object of the present invention to provide a method for generating an output signal of a quadrature-type mixer and such a quadrature-type mixer so that undesirable mixing frequencies in its output signal are largely reduced without an increase of the amount of circuit arrangement.

This object is achieved according to the invention by the fact that each mixer is supplied with a modulation signal consisting of a sequence of M d.c. signals having a repetition frequency corresponding to said desired modulation frequency $f_m$ and being stored in a storage device as predetermined voltage values assigned to phase angles of a periodical wave, the voltage values of the individual d.c. signals of the sequence being determined such that the combination of all m th d.c. signals simultaneously supplied to all modulators results in an output signal of the mixer having the frequency $f_o$ of the carrier signal, a predetermined identical amplitude for all combinations of the d.c. signals and an angular phase position in relation to the respective combination of the simultaneously supplied d.c. signals, said angular phase position being equal to $m(360°/M)$, m and M being integers with the relation $1 \leq m \leq M$ and m being the sequential index of said sequence of said M d.c. signals.

The method according to the invention achieves the elimination of undesirable mixing frequencies as far as possible without an increase in the amount of circuit arrangements. Rather, the deficiencies inherent to the circuit arrangement are deliberately taken into account and compensated for by supplying the modulators with modified modulation signals in such a manner that an almost ideal output signal is obtained. In one practical example of a quadrature mixer, where the undesirable mixture products were suppressed in the output signal by approx. 20 db, the undesirable mixture products could be readily suppressed, by application of the method according to the invention, up to approx. 50 db. The improvement regarding the efficiency of quadrature mixers thereby achieved opens up novel applications and offers the chance to solve quite a number of problems which have been encountered heretofore in connection with the processing of the frequency in spectroscopic instruments which require rf signals of high stability and purity, as for example in the field of nuclear magnetic resonance, ion cyclotron resonance, and the like.

The invention offers the additional advantage that it is not only applicable in connection with quadrature mixers comprising two ring modulators, but permits absolutely novel mixer designs using, as modulators, three or four electronically controllable attenuators to which the carrier signal can be supplied with a relative phase displacement of 120° or 90°. One of the attenuators may in this case even be adjusted to a predetermined constant attenuation factor. It is true than when attenuators are used the number of components required is higher than in the case of ring modulators. However, the structure of an attenuator is much simpler than that of a ring modulator so that altogether a considerable simplification of the structure of the mixer is achieved.

The d.c. voltages to be applied to the inputs of the modulators can be generated in many different ways, for example by the use of correction means arranged downstream of the oscillators generating the modulation signal, or by recording and reading out the determined voltage values in analog or digital form.

According to a particularly preferred embodiment of the method according to the invention, the voltage values of the different combinations of d.c. signals are stored as digital figures, read with a pulse repetition rate resulting in the desired modulation frequency, and thereafter converted into corresponding analog signals which are then supplied to the modulators.

The use of this method not only provides the particular advantage that the required voltage values can be called in with high accuracy; in addition, it is relatively easy to very the digital figures to be stored until the output signal of the quadrature mixer has the predetermined amplitude and the desired phase position, whereafter the figures so determined can be stored at the location assigned to the respective phase position.

From DE 30 07 907 A1 and U.S. Pat. No. 4,090,145 digital mixers have been known where the modulation signals are generated by reading out numerical values from sine and cosine tables. However, the modulators of these known mixers are formed by digital multipliers which are also supplied with the signal to be heterodyned, after analog-to-digital conversion, as a sequence of digital figures, and whose output signal is a digital signal which is then also subjected to digital processing.

The difference between this embodiment of the method according to the invention and the before-described prior art resides not only in the fact that a quadrature mixer of conventional design is used but that the modulation signal for the modulators is generated by converting figures, which are read out from a sine or cosine table at a rate determining the modulation frequency, to an analog signal. Rather, in the case of the method according to the invention, the figures of the sine or cosine table are replaced by values which have been determined experimentally and which actually lead to an output signal having the predetermined amplitude and the phase position which conforms to that phase position to which the stored values are assigned.

The present invention further relates to a quadrature-type mixer comprising at least two modulators, each modulator having a first and a second input, a carrier signal generator for generating a carrier signal with a frequency $f_o$, an output of the carrier signal generator being connected to the first input of one modulator directly and to the first input of at least one other modulator via a phase shifter effecting a phase shift between the first inputs of said one modulator and said at least one other modulator, the amount of said phase shift being predetermined in accordance with the number of said modulators, and a modulation signal generator for generating a plurality of mutally phase-shifted modulation signals having a frequency $f_m$, and a respective amount of the phase shift of the modulations signals being equal to said amount of said phase shift generated by said phase shifter, the number of the plurality of the modulation signals being equal to the number of the modulators, said modulation signals being supplied to the second inputs of the modulators, respectively. According to the invention the said modulation signal generator is designed as a digital synthesizer comprising memory means for storing M numerical values in correspondence to phase angles of a periodical wave, digital-to-analog converters following the memory means, said digital-to-analog converters having outputs which are respectively connected to the second inputs of the modulators, and means reading out numerical values from the memory means with a clock frequency determining the modulation frequency $f_m$ and supplying the numerical values to said digital-to-analog converters for supplying the modulators with predetermined voltage values in relation to said phase angles of said periodical wave, the voltage values of the individual d.c. signals of the sequence being determined such that the combination of all the d.c. signals simultaneously supplied to all modulators results in an output signal of the mixer having the frequency $f_o$ of the carrier signal, a predetermined identical amplitude for all combinations of the d.c. signals and an angular phase position in relation to the respective combination of the simultaneously supplied d.c. signals, said angular phase position being equal to m (360°/M), m and M being integers with the relation $1 \leq m \leq M$ and m being the sequential index of said sequence of said M d.c. signals.

As has been mentioned before, such a mixer may be a quadrature mixer comprising two ring modulators. However, the modulators of the mixer may also consist of three or four electronically controlled attenuators. In the case of four attenuators, the carrier and modulation signal must be split up into four portions which are cyclically displaced by 90° (0°, 90°, 180°, 270°). The output signal in then composed of four partial signals consisting of pairs of such portions displaced by 180° so that each pair can supply any desired positive or negative contribution to the output signal of the mixer, similar to a ring modulator. It is not necessary in this case to run the attenuators fully to zero.

Considering that it is necessary only to have the possibility to generate an output signal of constant amplitude and desired phase it will, basically, be sufficient if two linearly independent modulation signals are used. If one considers that the phase is to be shifted by full 360°, at least three attenuators will be required if simple attenuators are used which do not permit to change signs. A symmetrical arrangement will lead to the signals being split up into three portions shifted by 120° each. Generally, it will also suffice to keep the attenuation factor of one attenuator constant and to vary only the other two of them, provided the condition is fulfilled that the different contributions must add up to a total signal of fixed amount and the desired phase position. If this condition is fulfilled, the modulation voltages for the two ring modulators or for the three or four attenuators of the mixer may be freely selected. In particular, one does no longer necessarily obtain, for the individual signals, sine-shaped curves as a function of the phase of the output signal, not even for ideally functioning electronic components. One has to accept, however, in such cases that the magnitude of the individual signals must be greater by phase than the output signal.

The invention will now be described in more detail by way of the embodiments illustrated in the drawing. The features which can be derived from the description and the drawing may be used in other embodiments of the invention either individually or in any desired combination thereof.

DESCRIPTION OF THE PREFERRED EMBODIMENT

Figure 1:
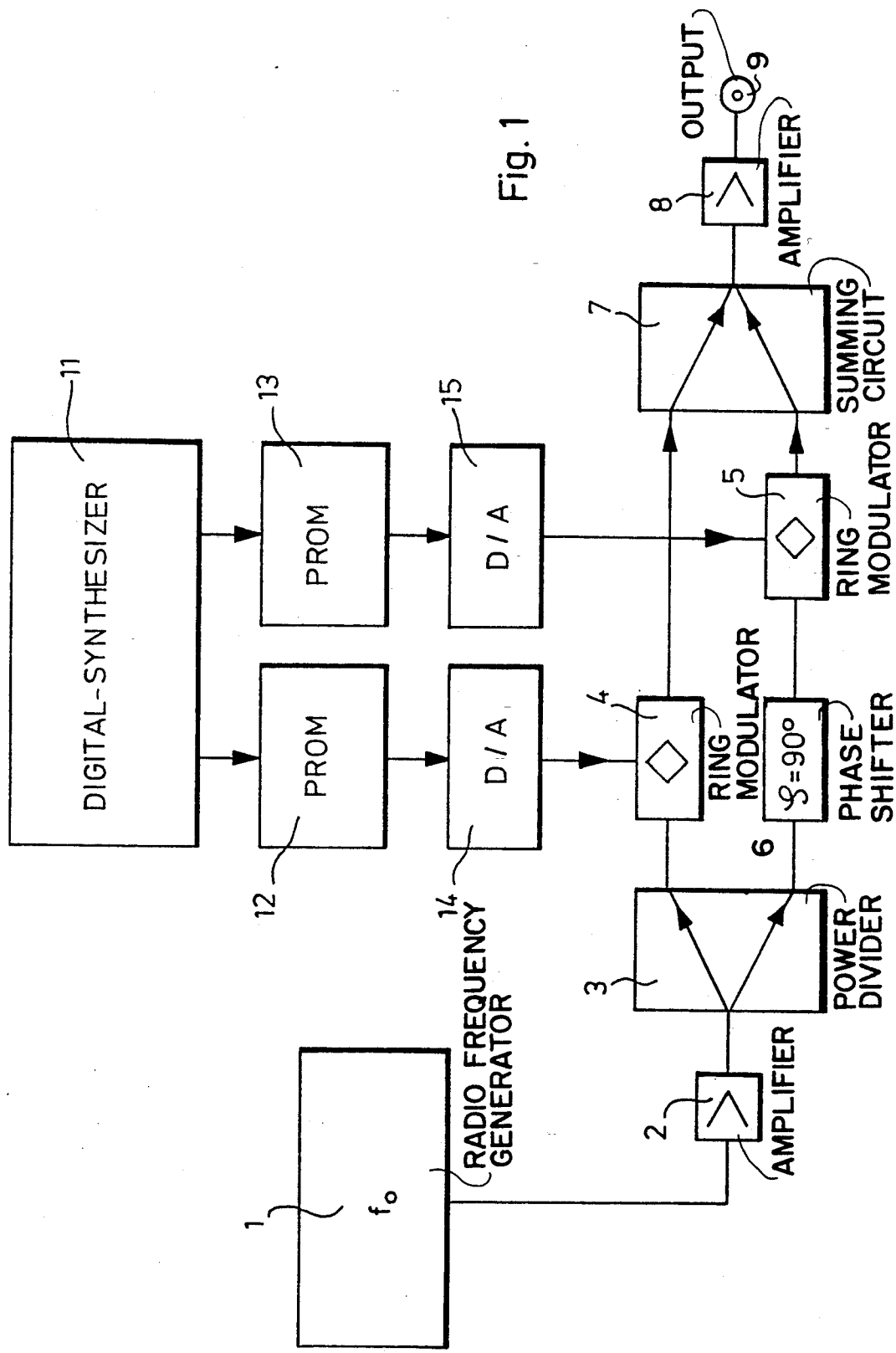
FIG. 1 shows the block diagram of a quadrature mixer designed according to the invention.

FIG. 1 shows a conventional quadrature mixer for generating an rf signal of variable frequency, by mixing a carrier frequency $f_o$ and a modulation frequency $f_m$. Accordingly, the circuit arrangement shown in the drawing comprises an rf generator 1 for generating a signal having the carrier frequency $f_o$. This generator may take the form of a quartz oscillator of high stability. In usual applications, the carrier frequency $f_o$ is in the range of some hundred megahertz.

The output signal of the rf generator 1 is supplied, via an amplifier 2, to a power divider 3 whose outputs are connected to a first ring modulator 4 directly, and to a second ring modulator 5 via a 90° phase shifter 6. The output signals of the ring modulators 4 and 5 are combined by means of a summing circuit 7 and then supplied to the output 9 of the quadrature mixer via another amplifier 8.

The modulation signals of the frequency $f_m$ supplied to the ring modulators 4 and 5 are generated by a circuit arrangement comprising a digital synthesizer 11, two digital storages 12 and 13, and two digital-to-analog converters 14 and 15 whose outputs are connected each to one of the modulation inputs of the ring modulators 4 and 5. The storages 12 and 13, which may for example take the form of PROMs, store—at locations assigned to the angle values of a periodic oscillation—figures corresponding to voltage values which are read out in response to signals arriving from the digital synthesizer 11 and supplied to the associated digital-to-analog converter 14 or 15. One obtains in this manner two signals of sine or cosine shape, which are phase-shifted by 90° relative to each other, if a sine or cosine table is stored in the storages 12 and 13. The frequency $f_m$ of the modulation signal results from the repetition signal supplied by the digital synthesizer 11 which effects that the voltage values are read out from the storages 12, 13. The frequency $f_m$ of the modulation signal generated in this manner is usually in the range of between zero and some hundred kilohertz.

Figure 2:
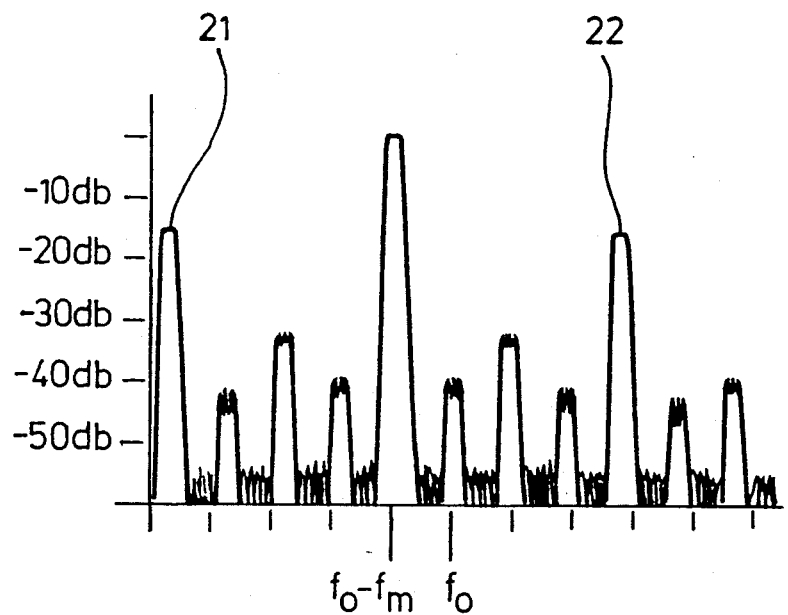
FIG. 2 shows the spectrum of an output signal of the quadrature mixer according to FIG. 1, using the sine and cosine tables of the prior art.

FIG. 2 shows the spectrogram of the output signal of the quadrature mixer according to claim 1 illustrating the case that pure sine and/or cosine tables are stored in the storages 12 and 13 in the conventional manner. The carrier frequency $f_o$ is 500 MHz, the modulation frequency $f_m$ is 100 KHz. One can see that in addition to the main line with the frequency $f_o - f_m$ a plurality of additional lines occur at a spacing of 100 KHz which are representative of other mixture products. One can see lines 21, 22 which are attenuated by as little as approx. 15 db, relative to the desired mixed signal.

Figure 3:
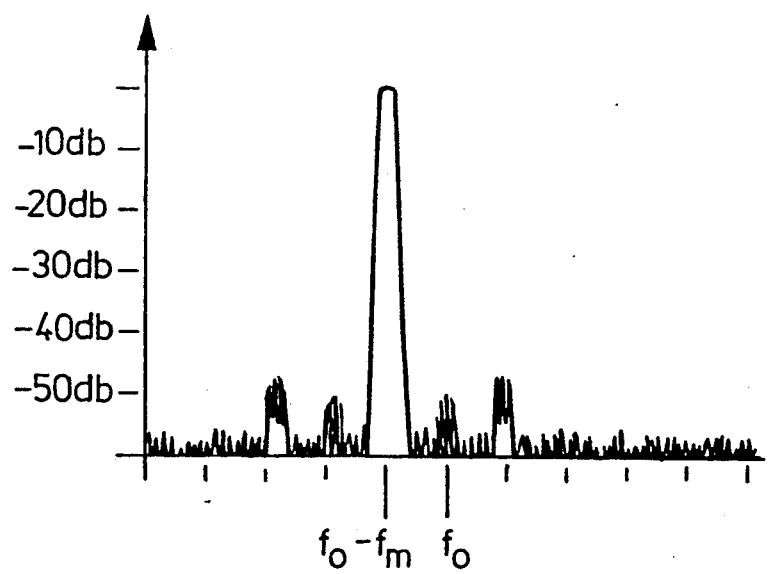
FIG. 3 shows the spectrum of the output signal of the quadrature mixture according to FIG. 1, using experimentally determined tables of voltage values according to the invention.
Figure 4A:
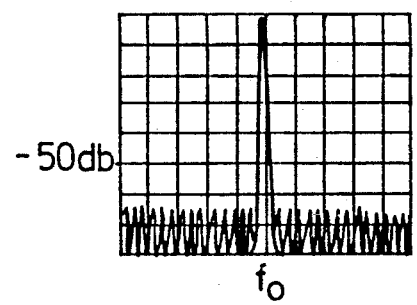
FIGS. 4a–4i show the spectra of other output signals of the quadrature mixer according to FIG. 1, obtained by the method according to the invention.
Figure 4B:
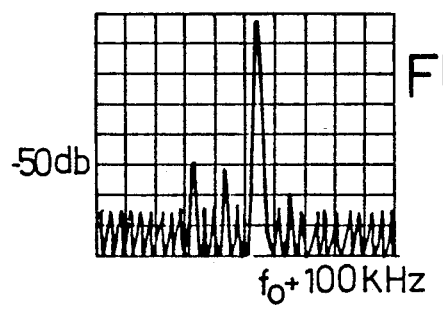
Figure 4C:
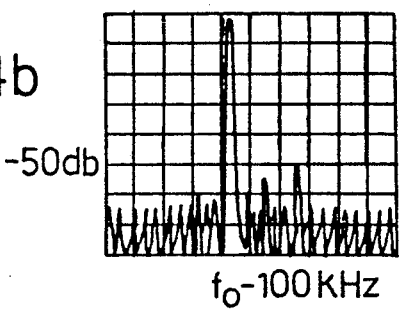
Figure 4D:
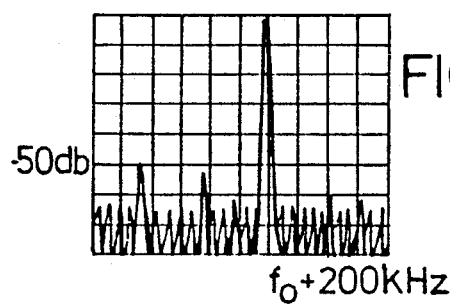
Figure 4E:
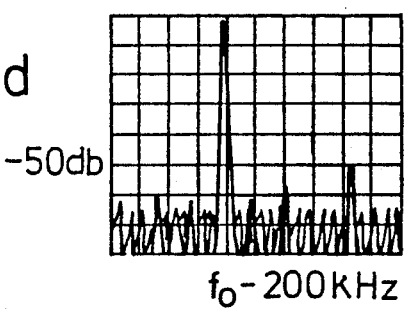
Figure 4F:
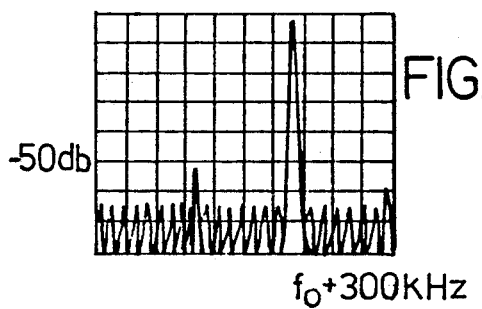
Figure 4G:
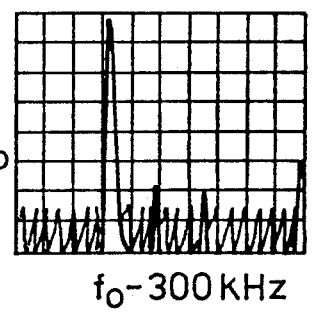
Figure 4H:
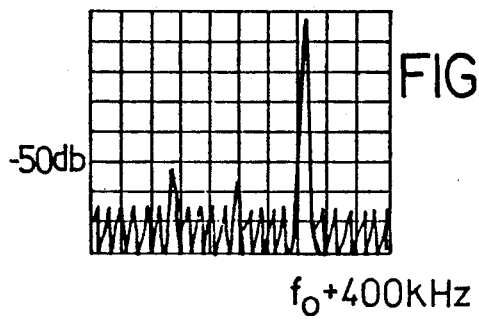
Figure 4I:
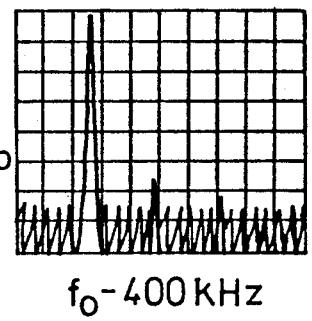

According to the invention, the stores 12, 13 are not used in the conventional manner for storing sine and/or cosine tables, but store instead experimentally determined values which when converted into a voltage which is supplied to the ring modulators 4, 5 lead to a signal of the carrier frequency $f_o$ at the output of the quadrature mixer which, when the amplitude of the carrier signal applied remains constant, leads to an output signal of predetermined amplitude whose phase position corresponds exactly to the angle value at which those figures are stored which determine the magnitude of the dc voltage pair supplied to the ring modulators 4, 5. If these values are read out by means of the digital synthesizer 11, in the sequence determining the modulation frequency, then the ring modulators 4, 5 are not supplied with sine-shaped signals, but rather with signals which are distorted relative to sine functions in such a manner that the errors of the quadrature mixer are compensated for and an output signal is obtained which contains only very small portions of other mixture products, in addition to the desired combination frequency $f_o - f_m$. The result obtained by the use of such modified values is illustrated in FIG. 3. It can be seen that the very strong lines 21, 22 have completely disappeared in the spectrum of FIG. 3, and only in the neighborhood of the desired output signal having the frequency $f_o - f_m$ one still sees other lines which are attenuated by approx. 50 db, relative to the desired signal. This improvement of the output signal of the quadrature mixer achieved with the aid of the method according to the invention is spectacular so that no additional comments are needed.

FIGS. 4a–4i show other diagrams of output signals obtained with the aid of a quadrature mixer operating according to the method according to the invention. Illustration a) in the first line shows the spectrum of a pure carrier frequency $f_o = 100$ MHz. The next illustrations, b) and c), then show the sum and differential signal, after mixture with a modulation frequency of $f_m = 100$ KHz. Correspondingly, the following diagrams illustrate the results obtained after mixture with modulation signals of the frequencies 200 KHz, 300 KHz and 400 KHz. It appears that the noise components appearing beside the desired output signal $f_o + f_m$ are attenuated by approx. 50 db, relative to the desired output signal. The diagrams also show that—as could be expected—the improvement achieved is largely independent of the frequency of the modulation signal.

Figure 5:
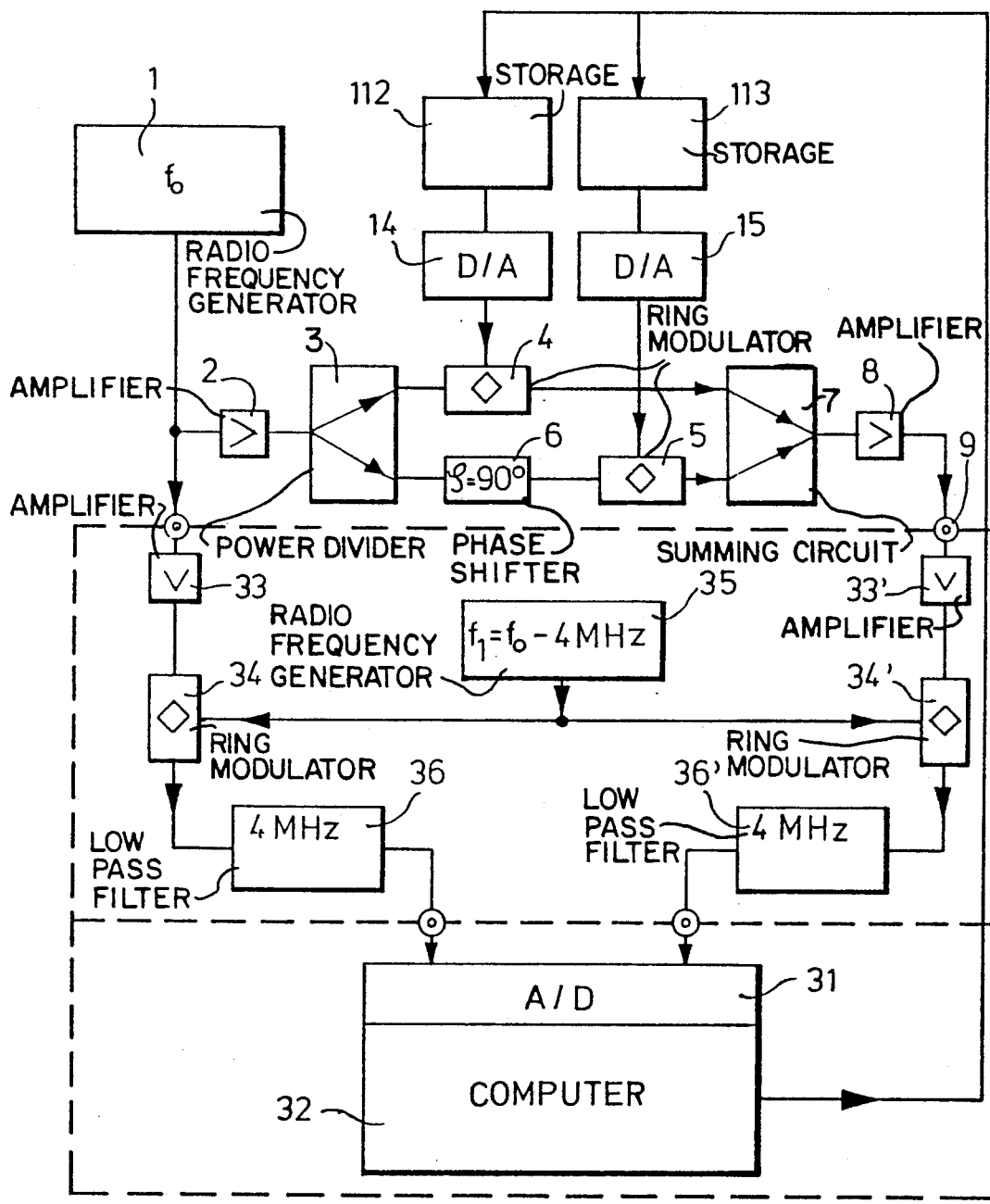
FIG. 5 shows the block diagram of a circuit arrangement for determining the pairs of values to be used according to the invention.

FIG. 5 shows a circuit arrangement which enables those voltage values to be determined which must be supplied to the ring modulators in order to obtain an output signal which is largely free from noise components. The upper portion of FIG. 5 shows once more the essential part of the arrangement of a quadrature mixer as illustrated in FIG. 1 so that this arrangement need not be described here again. Contrary to FIG. 1, however, the digital synthesizer is missing and the PROMs have been replaced by storages 112, 113 into which numerical values determined by a computer 32 can be input. The computer 32 is connected to the input and the output of the quadrature mixer via a reversible analog-to-digital converter 31. It is capable of determining the amplitude and phase of an rf oscillation from the numerical values supplied by the analog-to-digital converter 31, which represent the scanned values of the momentary voltage of the rf signal. Considering that more than two scanning operations per period are necessary for picking up a sine oscillation and, as has been mentioned before, that the carrier frequency $f_o$ is in the range of some hundred megahertz in the case of the applications of interest, scanning can no longer be carried out readily with the required rapidity. It is therefore provided in the case of the circuit arrangement illustrated in FIG. 5 that both the carrier signal supplied by the rf generator 1 and the output signal of the quadrature mixer are supplied to the analog-to-digital converter 31, via an amplifier 33 or 33', respectively, and a ring modulator 34 or 34', where these signals are heterodyned with an rf signal supplied by the rf generator 35. The frequency $f_1$ is, for example, in the range of $f_o-4$ MHz so that the signal leaving the ring modulators 34 or 34' has a frequency of $f=4$ MHz. The output signals of the ring modulators 34, 34' are supplied, via corresponding low-pass filters 36, 36', to the analog-to-digital converter 31 which operates at a cycle frequency of 100 MHz and supplies figures corresponding to the voltage values scanned with this frequency. The correspondingly programmed computer 32 is then in a position to compare the amplitude and phase of the signals derived from the output 9 of the quadrature mixer with the amplitude and phase of the carrier signal supplied by the rf generator 1 and, if deviations from the nominal value are determined, to vary the numerical values stored in the storages 112, 113, which determine the amplitude and phase of the output signal of the quadrature mixer, systematically until the transformed output signal has the correct phase and the correct amplitude. The numerical values so determined are then permanently stored, in particular transferred to the PROMs 12, 13 used in the quadrature mixer according to FIG. 1. It is possible in this manner to determine and store successively all values which assign to a sufficiently close sequence of angle values those numerical values which lead in any case to an output signal of the quadrature mixer having a constant amplitude and the correct phase position. The frequency conversion carried out for the purpose of determining these values does not lead to notable errors because any different behavior of the two ring modulators 34, 34' during such frequency conversion will influence only the amplitude relationship and the phase difference between the signals derived from the carrier signal and the output signal. But this influence remains constant so that it does not affect neither the adherence to a constant amplitude relationship, nor the determination of the respective relative phase position.

Figure 6:
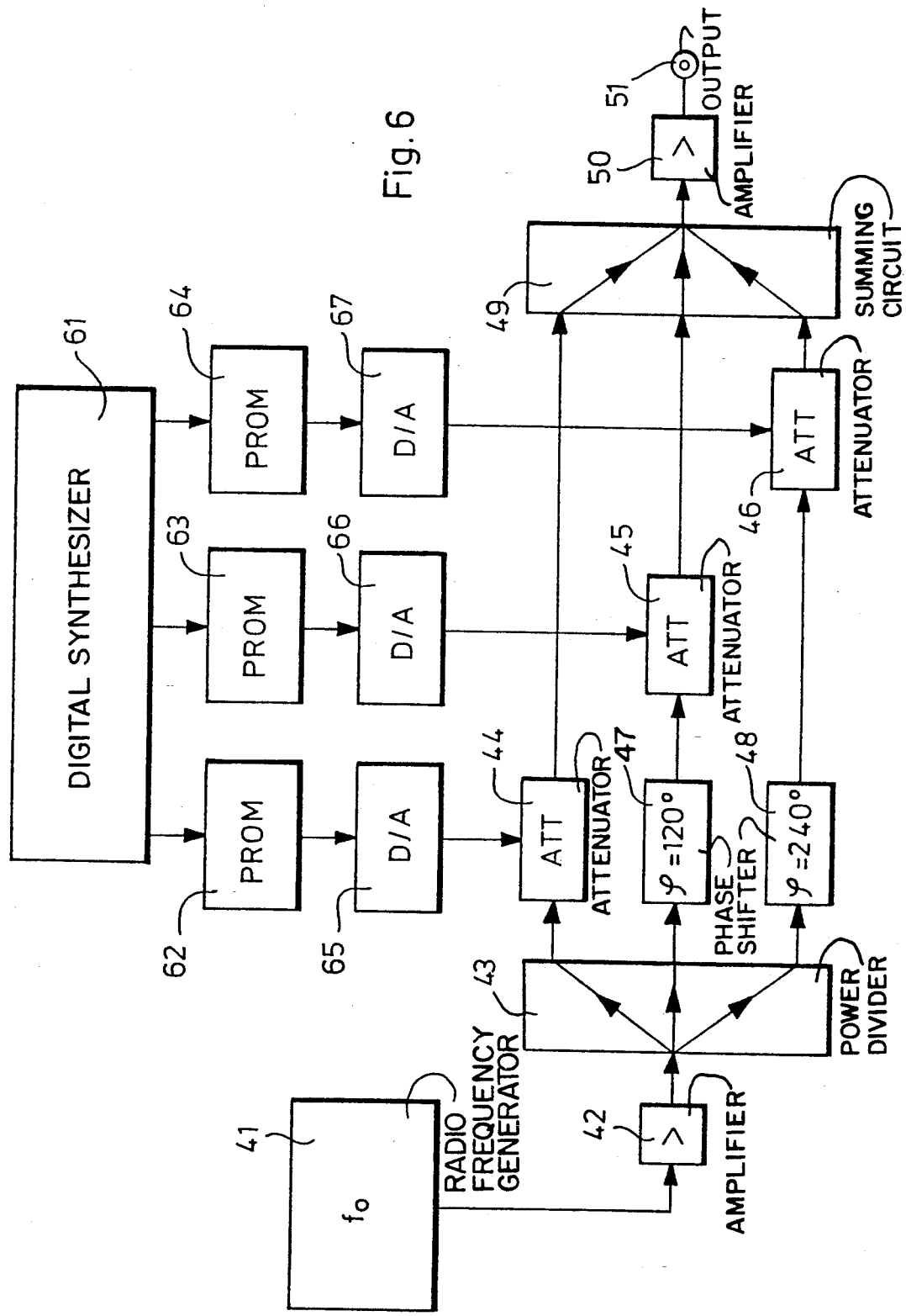
FIG. 6 shows the block diagram of a mixer designed according to the invention, comprising three electronically controllable attenuators.

The mixer illustrated in FIG. 6 differs from the quadrature mixer according to FIG. 1 in that it contains electronically controllable attenuators instead of ring modulators. As, in contrast to ring modulators, such attenuators cannot supply output signals having a phase which is displaced by 180° relative to the input signal (i.e. negative signals), the carrier signal supplied to the attenuators must be phase-shifted in such a manner that at least one of the attenuators supplies an output signal with "negative" phase position which, in combination with the output signals of the other attenuators then makes it possible again to let the vector representing the output signal describe a full circle. For this purpose, it will be sufficient to provide three attenuators and to supply the carrier signal to each of them with a phase displacement of 120°.

Accordingly, the modulator represented in FIG. 6 also comprises an rf generator 41 for generating a carrier signal having the frequency $f_o$ whose output signal is supplied, via an amplifier 42, to a power divider 43 whose outputs are connected to a first attenuator 44 directly, and to two other attenuators 45, 46 via a phase shifter 47 and 48, respectively. The first one of these two phase shifters 47 effects a phase displacement of 120°, while the second phase shifter 48 effects a phase displacement of 240°. The output signals of the attenuators 44, 45, 46 are again combined by means of a summing circuit 49 and supplied to the output 51 of the mixer via another amplifier 50.

As has been mentioned before, the attenuators 44, 45, 46 can be controlled electronically, which means that the degree of attenuation can be adjusted by electronic signals supplied to the attenuators. The signals are supplied to the attenuators in the form of modulation signals of the frequency $f_m$ which are generated, exactly as described in connection with FIG. 1, by a digital synthesizer 31, three digital storages 62, 63, 63 and three digital-to-analog converters 65, 66, 67, whose outputs are connected to one of the control inputs of the attenuators 44, 45, 46, respectively. The storages 62, 63, 64 contain again numerical values corresponding to voltage values which are stored at locations assigned to the angle values of a periodic oscillation and which are read out in response to signals arriving from the digital synthesizer 61 and supplied to associated digital-to-analog converters. The numerical values contained in the storages 62, 63, 64, which may again take the form of PROMs, have been determined in the manner described before in such a manner that when the stored numerical values are scanned cyclically by means of the digital synthesizer 61, the vector representing the output signals describes a full circle. Therefore, when the stored numerical values are scanned by the digital synthesizer 61 with a cycle frequency corresponding to the modulation frequency $f_m$ one obtains again an output signal which is displaced by the frequency $f_m$ of the modulation signal, relative to the carrier frequency $f_o$.

Figure 7:
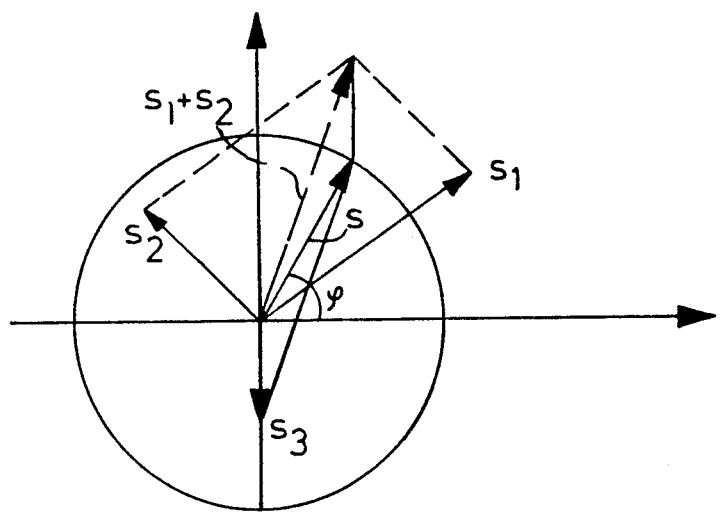
FIG. 7 shows a vector diagram illustrating the combination of the output signals of the attenuators to the output signal of the mixer according to FIG. 6.
Figure 8:
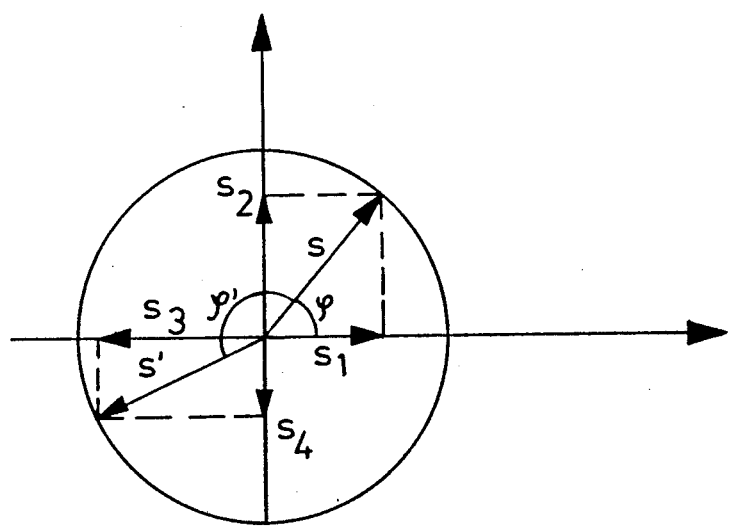
FIG. 8 shows a vector diagram similar to FIG. 7, but for a mixer comprising four attenuators.

The diagram of FIG. 7 illustrates how a combined signal $S = S_1 + S_2 + S_3$ is formed from the three output signals $S_1$, $S_2$, $S_3$ whose phases are shifted by 120° relative to each other. It is readily seen that by varying the amplitude of the three components $S_1$, $S_2$ and $S_3$, a combination signal S of any desired phase position and constant amplitude can be generated. The process of generating the output signal corresponds to the conventional generation of a rotary field by means of three a.c. voltages which are phase-shifted relative to each other. As appears from FIG. 4, the amplitude of the combination signal may, however, be smaller than the amplitude of one or more of the three components forming the combination signal. In addition, it can be easily shown that one of the three signals components need not be subjected to amplitude modulation, but may remain constant, so that one of the controlled attenuators could be eliminated from the mixer shown in FIG. 3, although three phase-shifted signals have of course to be combined. A mixter similar to the embodiment shown in FIG. 3 can be built up also using four attenuators to which the carrier signal in then supplied phase-shifted by 90°. As appears from FIG. 8, the output signals of two attenuators, to which the carrier frequency is supplied phase-shifted by 90° and which accordingly delimit a quadrant of the circle described by the vector, would suffice to generate an output signal of desired phase lying in the same quadrant. In the diagram illustrated in FIG. 8, for example, the output signals $S_1$ and $S_2$, which delimit the first quadrant, generate an output signal S while the output signals $S_3$ and $S_4$ delimiting the third quadrant generate the output signal S' in this third quadrant. Analogously, output signals of the mixer lying in the second and fourth quadrants, respectively, can be generated by means of the output signals $S_2$ and $S_3$, and $S_1$ and $S_4$, respectively, of the attenuators. It is of course a procondition for this design that the attenuators can be completely blocked. Such blocking is, however, not necessary when the signals remaining when the greatest attenuation factor is applied are compensate*d by correspondingly higher output signals of those attenuators to which the carrier frequency is supplied with a phase displacement of 180°.

It will be seen that the invention makes it possible in an easy manner to generate, by a mixing operation, and output signal of high stability and purity of variable frequency. Generally mixers designed and operated according to the invention may be used with carrier frequencies starting in the range of 100 KHz. In certain preferred applications, carrier frequencies of more than 10 MHz are encountered. Suitable applications for the invention are, for example, the generation of the decoupling frequency in an NMR spectrometer, i.e. the generation of a proton frequency in the 100 MHz range, which must be variable by maximally +100 KHz in order to permit exact tuning to an NMR frequency; further the generation of an excitation signal in a CW spectrometer whose frequency is also in the stated range and must be continuously tunable by approx. +100 KHz. The upper limit of the operating frequency of such a mixer should be in the gigahertz range.

We claim as our invention:

1. A quadrature-type mixer for generating an output signal comprising
    at least two modulators, each modulator having a first and a second input,
    a carrier signal generator for generating a carrier signal with a frequency $f_o$, an output of the carrier signal generator being connected to the first input of one modulator directly and to the first input of at least one other modulator via a phase shifter effecting a phase shift between the first inputs of said one modulator and said at least one other modulator, the amount of said phase shift being predetermined in accordance with the number of said modulators, and
    a modulation signal generator for generating a plurality of mutually phase-shifted modulation signals having a frequency $f_m$, and a respective amount of the phase shift of the modulation signals being equal to said amount of said phase shift generated by said phase shifter, the number of the plurality of the modulation signals being equal to the number of the modulators, said modulation signals being supplied to the second inputs of the modulators, respectively, the improvement comprising in that said modulation signal generator is a digital synthesizer comprising
    memory means for storing M numerical values in correspondence to M different phase angles of a periodical wave,
    digital-to-analog converters following the memory means. said digital-to-analog converters having outputs which are respectively connected to the second inputs of the modulators, and
    means reading out numerical values from the memory means with a clock frequency determining the modulation frequency $f_m$ and supplying the numerical values to said digital-to-analog converters for supplying the modulators with predetermined voltage values in relation to said phase angles of said periodical wave,
    the voltage values of the individual d.c. signals of a sequence being determined such that the combination of all m th d.c. signals simultaneously supplied to all modulators results in an output signal of the mixer having the frequency $f_o$ of the carrier signal, a predetermined identical amplitude for all combinations of the d.c. signals and an angular phase position in relation to the respective combination of the simultaneously supplied d.c. signals, said angular phase position being equal to m (360°/m), m and M being integers with the relation $1 \leq m \leq M$ and m being the sequential index of said sequence of said M d.c. signals.

2. The quadrature-type mixer according to claim 1, which comprises two ring modulators.

3. The quadrature-type mixer according to claim 1, which comprises electroncially controllable attenuators as modulators.

4. The quadrature-type mixer according to claim 3, which comprises one of the attenuators adjusted to a predetermined constant attenuation factor.

5. In the method for generating an output signal using a quadrature type mixer which includes at least two modulators, wherein the method includes supplying to the modulators, as a first signal, a carrier signal of a frequency $f_o$, phase shifting said carrier signal in accordance with the number of said modulators, applying a second input signal, a modulation signal, of a frequency $f_m$, said second input signal having phase shifts identical to the corresponding phase shifts of the first modulator input signal, and summing the modulation output signals to generate a mixer output signal, the frequency of the mixer output signal being equal to the sum or the difference of the frequencies of the carrier signal and the modulation signal, the improvement for generating and output signal virtually free of undesirable side bands and spurious frequencies comprising generating a modulation signal consisting of a sequence of M d.c. signals having a repetition frequency corresponding to said modulation frequency $f_m$, storing the M. d.c. signals as voltage values assigned to phase angles of a periodical wave, the voltage values of the individual d.c. signals of the sequence being such that the combination of all m th d.c. signals simultaneously applied to all modulators results in a mixer output wave function having the frequency $f_o$ of the carrier signal, and identical amplitude for all combinations of the d.c. signals, and an angular phase position in relation to the respective combination of the simultaneously supplied d.c. signals, said M d.c. signals having voltages which have been determined experimentally using the quadrature-type modulator and which lead to an output signal having a pre-determined amplitude and phase position, said angular phase position being equal to m (360°/M), and M being integers with the relation $1 \leq m \leq M$ and m being the sequential index of said sequence of said M d.c. signals.

6. The signal generating method according to claim 5 in which the voltage values of the individual combinations of all mth d.c. signals are stored as digital signals, and read out with a pulse rate resulting in the desired modulation frequency $f_m$ and thereafter converting the digital signals into corresponding analog signals which are then supplied to the modulators.

7. The signal generating method according to claim 6 wherein the M d.c. signals stored as digital figures, and thereafter converted from digital signals are into corresponding analog signals are read out from storage as sine functions modified in such a manner that signal errors of the quadrature-type mixer are compenated for, producing an output signal containing a minimum amount of signals other than the desired combination frequency $f_o = f_m$.

* * * * *